(12) United States Patent
Maruyama et al.

(10) Patent No.: US 11,145,969 B2
(45) Date of Patent: Oct. 12, 2021

(54) STRUCTURE, ANTENNA STRUCTURE, AND RADIO WAVE SHIELDING STRUCTURE INCLUDING TRANSPARENT CONDUCTOR

(71) Applicant: NIHON DENGYO KOSAKU CO., LTD., Tokyo (JP)

(72) Inventors: Akira Maruyama, Tokyo (JP); Yukio Sato, Tokyo (JP); Hiroki Hagiwara, Tokyo (JP)

(73) Assignee: NIHON DENGYO KOSAKU CO., LTD., Tokyo (JP)

( * ) Notice: Subject to any disclaimer, the term of this patent is extended or adjusted under 35 U.S.C. 154(b) by 0 days.

(21) Appl. No.: 16/642,376

(22) PCT Filed: Aug. 28, 2017

(86) PCT No.: PCT/JP2017/030726
§ 371 (c)(1),
(2) Date: Feb. 27, 2020

(87) PCT Pub. No.: WO2019/043756
PCT Pub. Date: Mar. 7, 2019

(65) Prior Publication Data
US 2020/0194883 A1 Jun. 18, 2020

(51) Int. Cl.
*H01Q 1/52* (2006.01)
*H01Q 1/12* (2006.01)
*G02B 3/08* (2006.01)

(52) U.S. Cl.
CPC .............. *H01Q 1/526* (2013.01); *G02B 3/08* (2013.01); *H01Q 1/12* (2013.01)

(58) Field of Classification Search
CPC ........ G02B 3/08; G02B 5/045; G02B 5/1876; G02B 19/0076; G02B 25/002;
(Continued)

(56) References Cited

U.S. PATENT DOCUMENTS

| 4,116,529 A | 9/1978 | Yamaguchi |
| 8,764,319 B2 | 7/2014 | Oh et al. |

(Continued)

FOREIGN PATENT DOCUMENTS

| CN | 201143819 | 11/2008 |
| CN | 103825086 | 5/2014 |

(Continued)

OTHER PUBLICATIONS

"International Search Report (Form PCT/ISA/210) of PCT/JP2017/030726," dated Nov. 14, 2017, with English translation thereof, pp. 1-2.
(Continued)

*Primary Examiner* — Collin X Beatty
*Assistant Examiner* — Grant A Gagnon
(74) *Attorney, Agent, or Firm* — JCIPRNET

(57) ABSTRACT

An antenna structure as an example of a structure including a transparent conductor includes: an antenna as an example of the transparent conductor; a film transmitting a visible light; a positioning structure configured to position the film from an invisible side of a ceiling as an example of a facility; and a flange transmitting the visible light and configured to position the film from a visible side of the ceiling and including a lens part at a position facing the positioning structure.

10 Claims, 11 Drawing Sheets

(58) Field of Classification Search
CPC .............. G02B 3/0056; G02B 13/0085; G02B 19/0009; G02B 19/0014; G02B 19/0042; G02B 19/009; G02B 1/04; G02B 27/027; G02B 27/0927; G02B 27/0972; G02B 5/1895; G02B 7/02; G02B 13/006; G02B 19/0028; G02B 1/041; G02B 1/14; G02B 25/008; G02B 27/1066; G02B 27/126; G02B 27/4272; G02B 3/0037; G02B 3/0043; G02B 3/005; G02B 3/06; G02B 5/1814; G02B 6/0006; G02B 6/003; G02B 6/4206; G02B 7/028; G02B 13/001; G02B 13/0025; G02B 13/0035; G02B 13/0055; G02B 13/0065; G02B 13/007; G02B 13/18; G02B 19/0033; G02B 19/0061; G02B 1/10; G02B 1/105; G02B 1/111; G02B 1/118; G02B 1/12; G02B 1/18; G02B 2003/0093; G02B 2005/1804; G02B 2027/015; G02B 21/0032; G02B 23/243; G02B 25/005; G02B 25/007; G02B 26/0833; G02B 26/0875; G02B 27/0006; G02B 27/0018; G02B 27/0025; G02B 27/0037; G02B 27/0101; G02B 27/02; G02B 27/021; G02B 27/022; G02B 27/025; G02B 27/026; G02B 27/028; G02B 27/04; G02B 27/0944; G02B 27/0966; G02B 27/10; G02B 27/123; G02B 27/30; G02B 27/4238; G02B 27/4261; G02B 27/4277; G02B 27/4283; G02B 30/27; G02B 30/56; G02B 3/0012; G02B 3/0031; G02B 3/0062; G02B 3/0068; G02B 3/0075; G02B 3/02; G02B 3/10; G02B 3/12; G02B 3/14; G02B 5/003; G02B 5/02; G02B 5/0215; G02B 5/0236; G02B 5/0242; G02B 5/0278; G02B 5/09; G02B 5/10; G02B 5/1833; G02B 5/1857; G02B 5/1861; G02B 5/1871; G02B 5/30; G02B 5/3041; G02B 6/0016; G02B 6/0018; G02B 6/0028; G02B 6/0051; G02B 6/32; G02B 6/4214; G02B 6/425; G02B 6/43; G02B 7/023; G02B 9/12; G02B 9/34; H01Q 1/12
USPC ............................................................ 359/741
See application file for complete search history.

(56) References Cited

U.S. PATENT DOCUMENTS

2014/0139379 A1   5/2014  Bolin et al.
2016/0172765 A1   6/2016  Motta-Cruz et al.

FOREIGN PATENT DOCUMENTS

| CN | 203850428 | 9/2014 |
| CN | 105321496 | 2/2016 |
| JP | H10126090 | 5/1998 |
| JP | 2001284929 | 10/2001 |
| JP | 2006287729 | 10/2006 |
| JP | 2016525849 | 8/2016 |

OTHER PUBLICATIONS

Zhang Guozhi, "The structure and optical principle of cat's eye", Physics Teaching vol. 34 No. 9, Sep. 2012, with machine English translation, pp. 1-6.

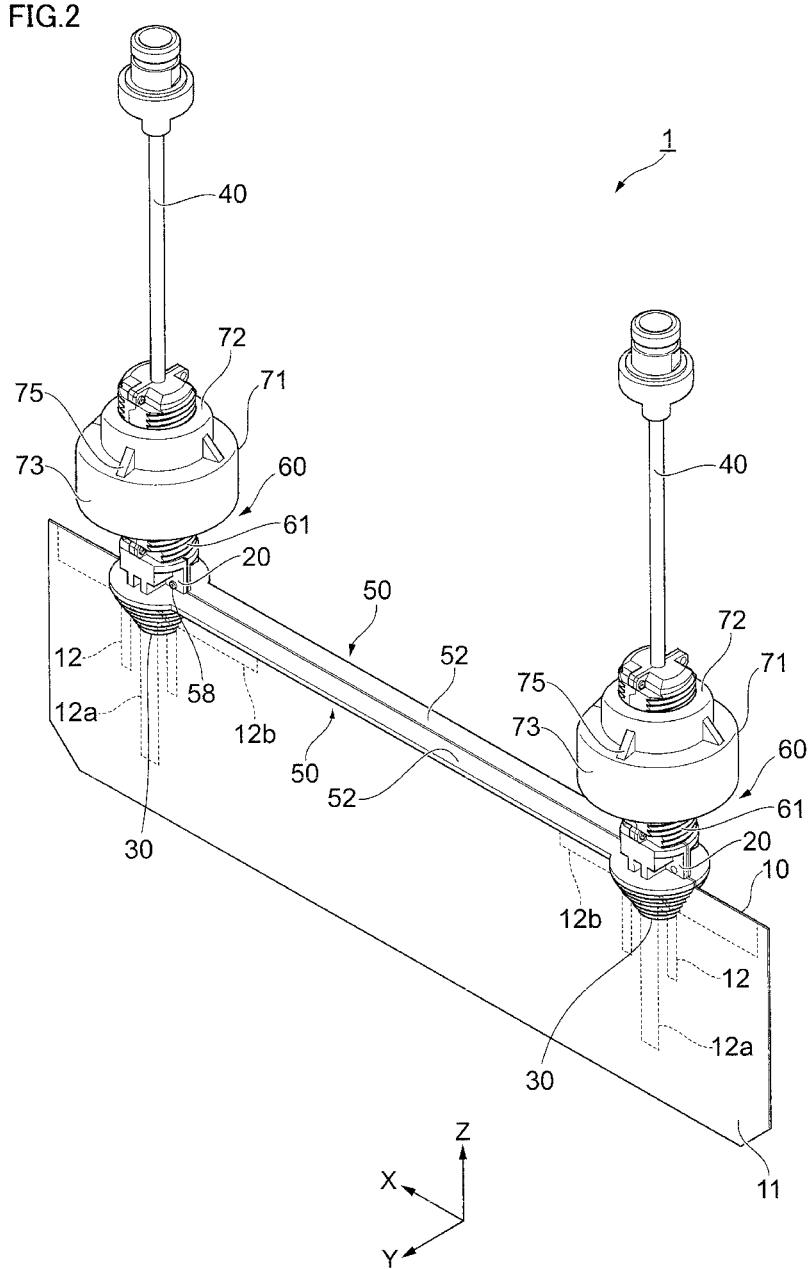

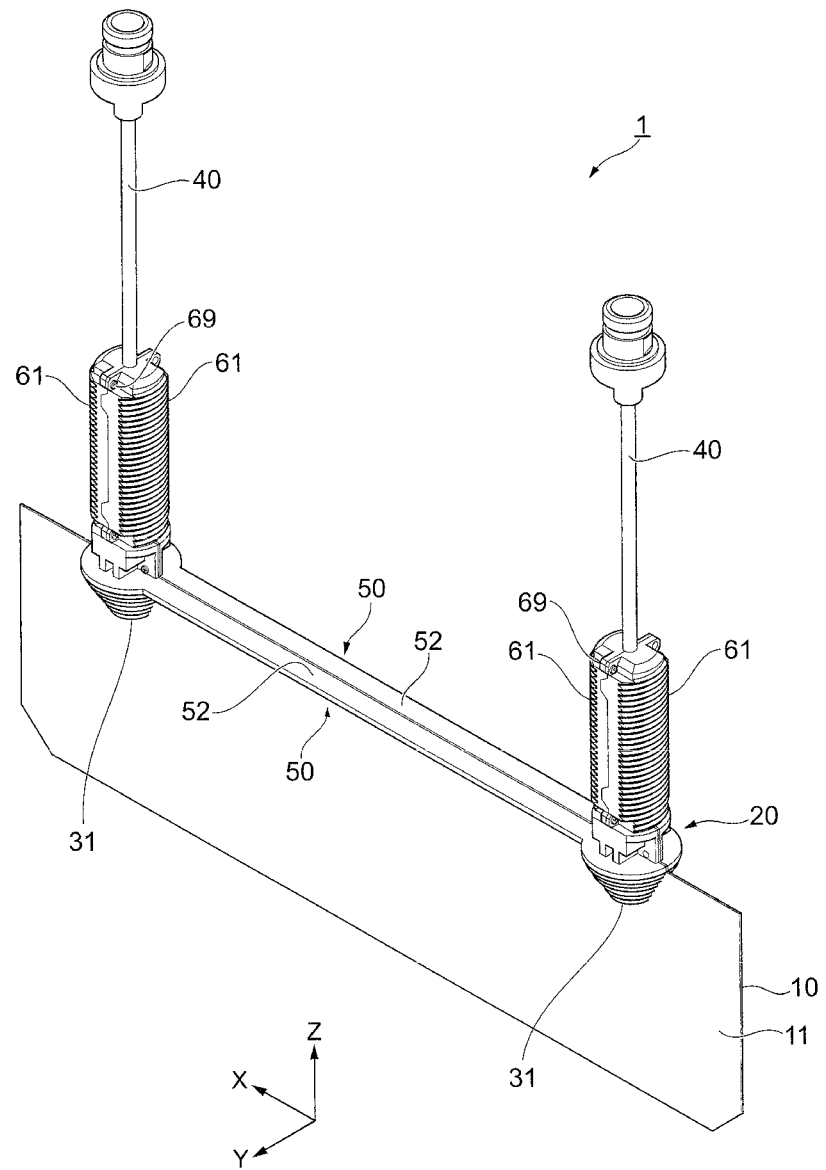

STRUCTURE, ANTENNA STRUCTURE, AND RADIO WAVE SHIELDING STRUCTURE INCLUDING TRANSPARENT CONDUCTOR

CROSS-REFERENCE TO RELATED APPLICATION

This application is a 371 application of the international PCT application serial no. PCT/JP2017/030726, filed on Aug. 28, 2017. The entirety of the above-mentioned patent application is hereby incorporated by reference herein and made a part of this specification.

TECHNICAL FIELD

The present invention relates to a structure, an antenna structure, and a radio wave shielding structure attached to a facility and including a transparent conductor.

BACKGROUND ART

Patent Document 1 discloses an optically transparent panel antenna assembly for easy integration in grazed surfaces and including an optically transparent antenna having an array of radiating elements that transmit or receive RF signals. The panel antenna assembly includes an optically transparent reflector, and the reflector includes a lower wall and two lateral walls each of which extends from the lower wall so that the array of radiating elements is maintained between the lateral walls of the reflector.

CITATION LIST

Patent Literature

Patent Document 1: Japanese National Publication of International Patent Application No. 2016-525849

SUMMARY OF INVENTION

Technical Problem

Structures including a transparent conductor such as visible light transmitting antennas are generally made transparent and designed to blend in the environment. However, these structures include, for example, connecting parts for supplying power to the transparent conductor and connecting parts to be connected to cables. These connecting parts and other elements of the structures may be opaque, for example. For this reason, there have been limitations on the extent to which the structures including the transparent conductor can have good appearance in relation to a facility such as a ceiling when the structures are fixed to the facility via through-holes and the like.

An object of the present invention is to provide a structure including a transparent conductor that can have better visual appearance when viewed from the visible side of a facility, as compared to when the technique of the present invention is not used.

Solution to Problem

According to a first aspect of the present invention, a structure including a transparent conductor includes: a base member including the transparent conductor and transmitting visible light; a positioning structure configured to position the base member from an invisible side of a facility; and a flange configured to position the base member from a visible side of the facility, the flange including a lens part at a position facing the positioning structure, the flange transmitting visible light.

According to a second aspect of the present invention, in the first aspect, the lens part of the flange includes a concave lens.

According to a third aspect of the present invention, in the second aspect, the concave lens of the lens part includes a concave surface on the invisible side and a stepped surface along the concave surface on the visible side.

According to a fourth aspect of the present invention, in the second aspect, the concave lens of the lens part includes a Fresnel lens.

According to a fifth aspect of the present invention, in the first aspect, the flange has a divided structure in which the flange is divided in a direction intersecting a direction in which the base member extends.

According to a sixth aspect of the present invention, in the fifth aspect, the lens part is divided by the divided structure of the flange, and the divided lens part sandwiches and fixes the base member.

According to a seventh aspect of the present invention, in the fifth or the sixth aspect of the present invention, the positioning structure includes a screw part and a tightening part, the screw part being divided in a direction intersecting the direction in which the flange is divided, the tightening part being screwed into the screw part to tighten the flange to the facility.

According to an eighth aspect of the present invention, in the first aspect, the flange includes plural lens parts corresponding to the number of plural positioning structures, and the flange includes a connecting part connecting the plural lens parts.

According to a ninth aspect of the present invention, in the first aspect, the structure further includes a feeding part connected with a feeding member for supplying power to the transparent conductor, wherein when the base member is attached to the facility, the feeding part is positioned to face the invisible side of the facility relative to the base member.

According to a tenth aspect of the present invention, in the ninth aspect, the feeding part is integrally formed with the flange and positioned on a side of the flange that is opposite to another side of the flange on which the base member is attached.

According to an eleventh aspect of the present invention, an antenna structure includes: a base member including a transparent conductor constituting an antenna, the base member transmitting visible light; a positioning structure configured to position the base member from an invisible side of a facility; and a flange configured to position the base member from a visible side of the facility, the flange including a lens part at a position facing the positioning structure, the flange transmitting visible light.

According to a twelfth aspect of the present invention, a radio wave shielding structure includes: a base member including a transparent conductor constituting a radio wave shielding membrane, the base member transmitting visible light; a positioning structure configured to position the base member from an invisible side of a facility; and a flange configured to position the base member from a visible side of the facility, the flange including a lens part at a position facing the positioning structure, the flange transmitting visible light.

Advantageous Effects of Invention

The first aspect of the present invention allows the structure to have a good visual appearance on the visible side of the facility when the structure is attached to the facility, as compared to when the technique of this aspect is not used.

The second aspect of the present invention allows the structure to have a good visual appearance on the visible side of the facility when the structure is attached to the facility, as compared to when the lens part is not a concave lens.

The third aspect of the present invention allows the structure to have a better visual appearance on the visible side of the facility, as compared to when the lens part does not include a stepped surface.

The fourth aspect of the present invention can reduce a protruding portion on the visible side, as compared to when the lens part is not a Fresnel lens.

The fifth aspect of the present invention can reduce costs, as compared to when the divided structure is not used.

The sixth aspect of the present invention can increase the fixing function of the flange provided on the visible side, as compared to when the configuration of this aspect is not used.

The seventh aspect of the present invention allows for better attachment of the base member formed with the antenna to the facility, as compared to when the configuration of this aspect is not used.

The eighth aspect of the present invention allows the structure including multiple positioning structures to have a better visual appearance on the visible side of the facility.

The ninth aspect of the present invention can make the feeding part hard to see from the visible side, producing a good appearance.

The tenth aspect of the present invention can provide integrity between the flange positioned on the visible side and the feeding part extending to the invisible side.

The eleventh aspect of the present invention allows the antenna structure to have a good visual appearance on the visible side of the facility when the antenna structure is attached to the facility, as compared to when the technique of this aspect is not used.

The twelfth aspect of the present invention allows the radio wave shielding structure to have a good visual appearance on the visible side of the facility when the radio wave shielding structure is attached to the facility, as compared to when the technique of this aspect is not used.

BRIEF DESCRIPTION OF DRAWINGS

FIG. 1A explains a configuration of the antenna structure, and FIG. 1B explains how the antenna structure is attached to a ceiling, which is an example of the facility.

FIG. 2 is a perspective view showing a detailed configuration of the antenna structure.

FIG. 3 is a perspective view of the antenna structure of FIG. 2 with a nut of a positioning structure removed from the antenna structure.

FIG. 5A shows the flange, FIG. 5B shows the screw part of the positioning structure, and FIG. 5C shows the nut of the positioning structure.

FIG. 6A explains the configuration of the lens part, FIG. 6B explains the case where the lens part is provided, and FIG. 6C explains the case where the lens part is not provided.

FIG. 8A shows a modification wherein the antenna structure includes four antenna units, FIG. 8B shows a modification wherein the antenna structure includes a single antenna unit, and FIG. 8C shows a modification wherein the antenna structure includes a differently sized antenna unit.

FIG. 9A explains the configuration of the antenna structure, and FIG. 9B explains how the antenna structure is attached to the ceiling as an example of the facility.

FIG. 10A explains the configuration of the lens part, FIG. 10B explains the case where the lens part is provided, and FIG. 10C explains the case where the lens part is not provided.

FIG. 11A explains the configuration of the radio wave shielding structure, and FIG. 11B explains how the antenna structure is attached to the ceiling as an example of the facility.

DESCRIPTION OF EMBODIMENTS

First Embodiment

The first embodiment of the present invention will be detailed below with reference to the attached drawings. Here, as an example of a structure including a transparent conductor, a description will be given of an antenna structure 1 including a transparent antenna as a transparent conductor. The transparent conductor may be other than the transparent antenna, as described later.

(Antenna Structure)

Referring to FIGS. 1 to 6, the antenna structure 1 of the first embodiment will be described.

Figure 1A:
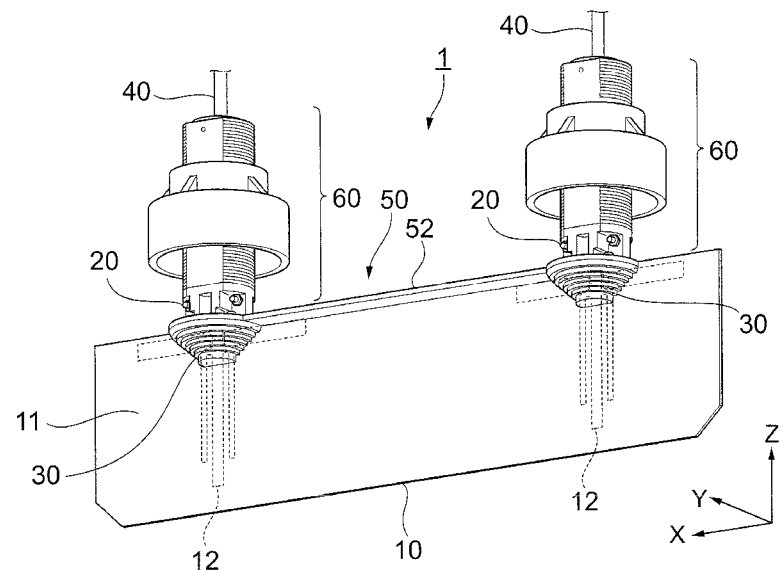
FIGS. 1A and 1B are perspective views of an antenna structure of the first embodiment.
Figure 1B:
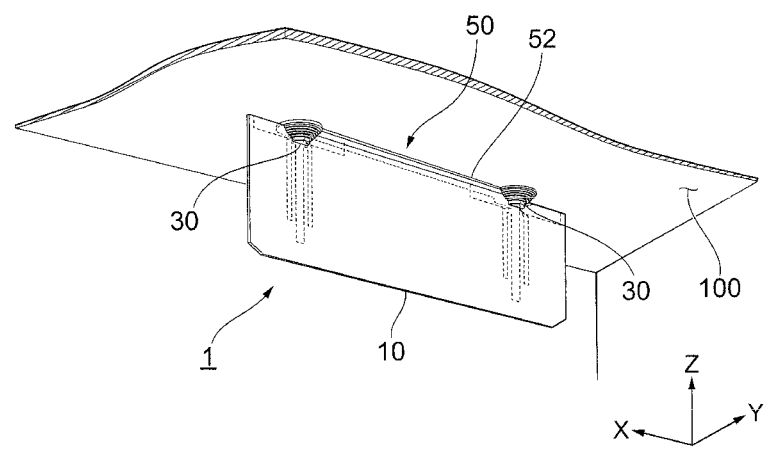
Figure 4:
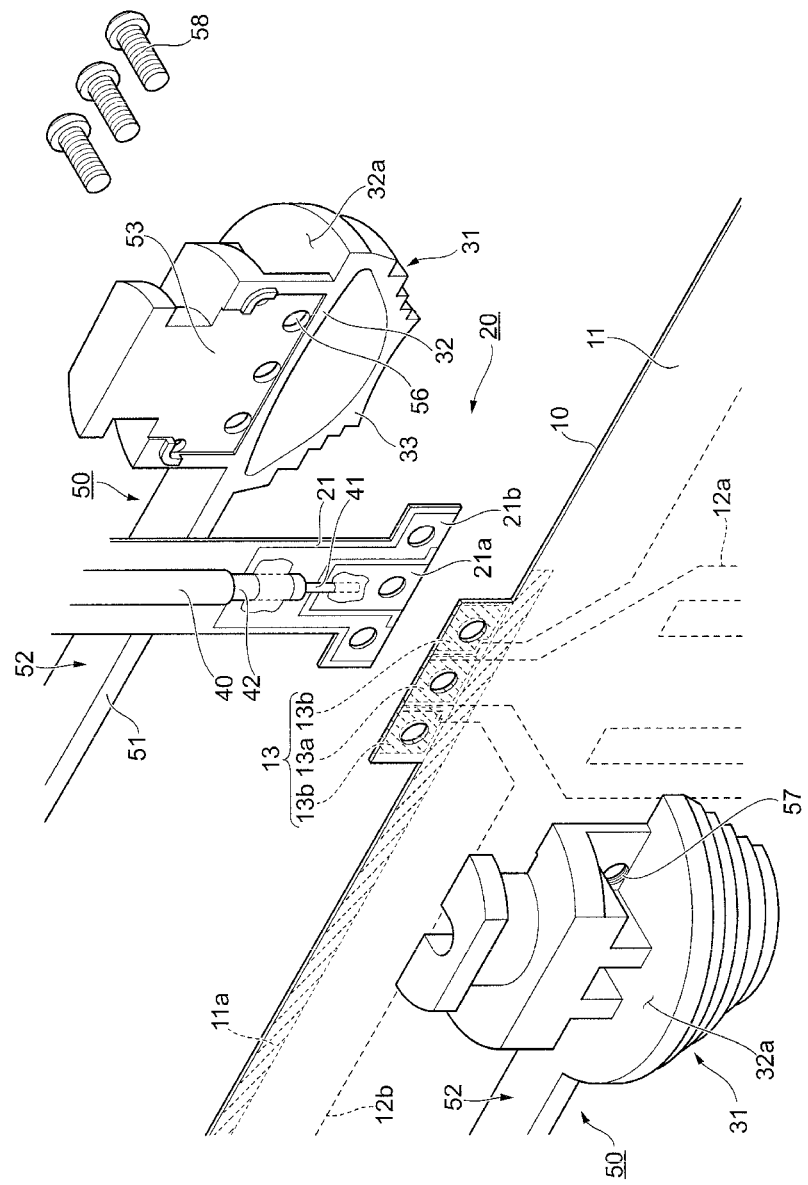
FIG. 4 explains a feeding part.
Figure 5A:
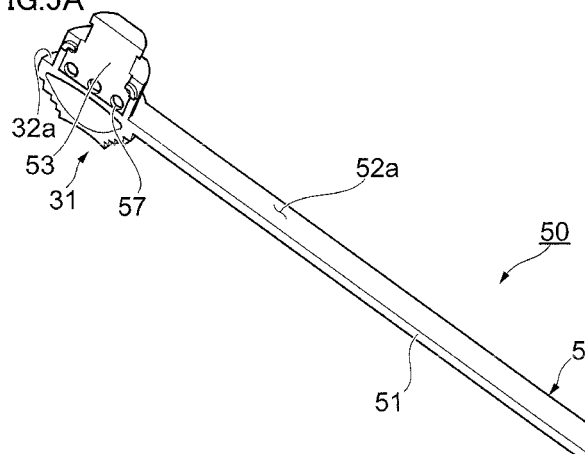
FIGS. 5A to 5C explains configurations of a flange, and a screw part and the nut of the positioning structure.
Figure 5B:
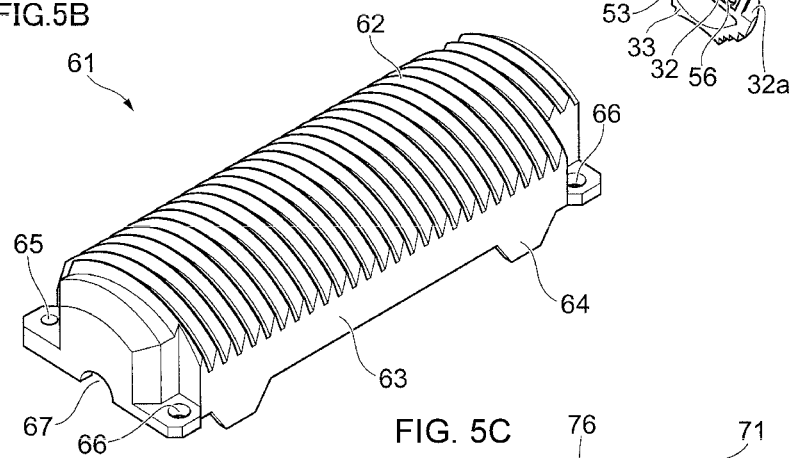
Figure 5C:
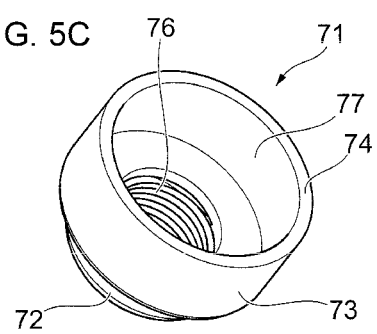
Figure 6A:
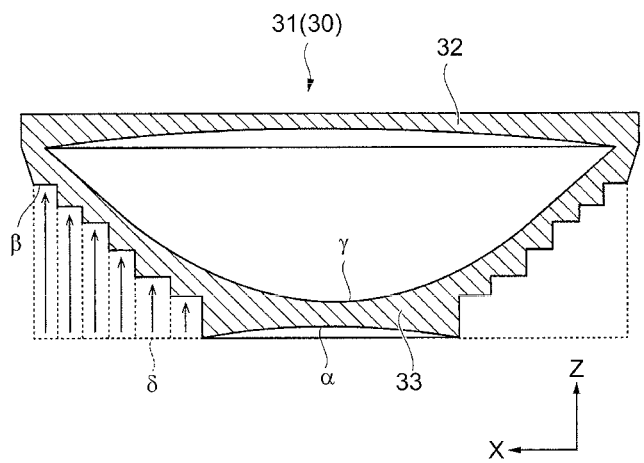
FIGS. 6A to 6C explain a configuration of a lens part of the flange and functions of the lens part.
Figure 6B:
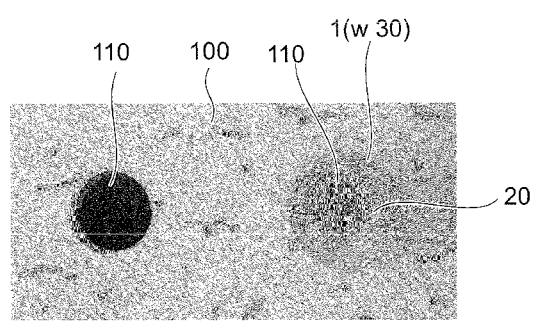
Figure 6C:
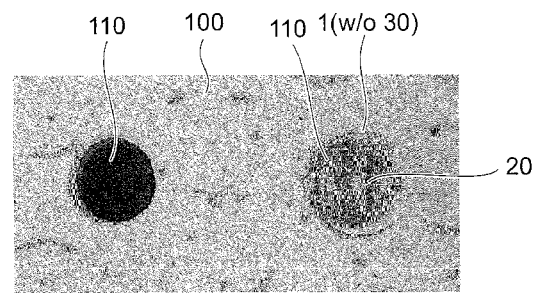

FIGS. 1A and 1B are perspective views of the antenna structure 1 of the first embodiment. FIG. 1A explains a configuration of the antenna structure 1, and FIG. 1B explains how the antenna structure 1 is attached to a ceiling 100, which is an example of the facility. FIG. 2 is a perspective view showing a detailed configuration of the antenna structure 1. FIG. 3 is a perspective view of the antenna structure 1 of FIG. 2 with a nut 71 of a positioning structure 60 removed from the antenna structure 1. FIG. 4 explains a feeding part 20. FIGS. 5A to 5C explains configurations of a flange 50, and a screw part 61 and the nut 71 of the positioning structure 60. FIG. 5A shows the flange 50, FIG. 5B shows the screw part 61 of the positioning structure 60, and FIG. 5C shows the nut 71 of the positioning structure 60. FIGS. 6A to 6C explain a configuration of a lens part 30 of the flange 50 and functions of the lens part 30. FIG. 6A explains the configuration of the lens part 30, FIG. 6B explains the case where the lens part 30 is provided (w 30), and FIG. 6C explains the case where the lens part 30 is not provided (w/o 30).

In FIGS. 1A, 1B, 2 and 3, an X direction is a direction in which a film 11 hanging straight down from a surface of a ceiling 100, which is an example of a facility, extends along the surface of the ceiling 100. A Y direction is a direction along the surface of the ceiling 100 and perpendicular to the X direction. A Z direction is a direction perpendicular to the X and Y directions and toward an invisible side of the ceiling 100 (the side above the ceiling 100).

As shown in FIG. 1A, the antenna structure 1 of the first embodiment includes an antenna unit 10 and feeding parts 20. The antenna unit 10, which is for example a flexible printed circuit board, is formed with a high frequency circuit. Each feeding part 20 is connected with a coaxial cable 40 as an example of a feeding member for supplying power to the antenna unit 10. The antenna structure 1 further includes a flange 50 and positioning structures 60 for positioning the antenna unit 10 and the feeding parts 20 on a facility such as the ceiling 100. As will be described later, each feeding part 20 is disposed inside the corresponding positioning structure 60. The flange 50 includes lens parts 30 on the visible side. The lens part 30 face the respective positioning structures 60. When viewed from the visible side, the lens parts 30 make the respective feeding parts 20 hard to see. The flange 50 (including the lens parts 30) is formed of a transparent member.

In FIG. 1A, each lens part 30 includes a structure on the back side of the antenna unit 10 that is symmetrical to the counterpart shown in FIG. 1A across the antenna unit 10 as the symmetry plane. That is, the lens part 30 is divided by the antenna unit 10. The antenna unit 10 is formed of a visible light transmitting member, and thus the lens part 30 is a concave lens as a whole.

The antenna structure 1 is attached to the ceiling 100 via through-holes (through-holes 110 in FIGS. 6B and 6C described later) in the ceiling 100 and by use of the flange 50 on the visible side and the positioning structures 60 on the invisible side.

As shown in FIG. 1B, when the antenna structure 1 attached to the ceiling 100 is viewed from the visible side, which is the side below the ceiling 100 (i.e., in a living space), the antenna unit 10 and the visible portion of the flange 50 can be seen. Even when the through-hole 110 is viewed, it is hard to see because of the lens part 30 formed of a transparent member. As such, all structures exposed and visible to users are made transparent and the flange 50 is provided with the lens parts 30, and this allows the antenna structure 1 to blend in the environment.

Detailed description will be given below.

[Antenna Unit 10]

As shown in FIG. 2, the antenna unit 10 may be configured as a film antenna. The antenna unit 10 includes, as a base member, a film 11 made of a highly light transmissive, transparent resin material transmitting visible light, such as polyethylene terephthalate (PET) resin. The film 11 is formed with antennas 12. Materials of conductors (transparent conductors) for the antennas 12 are chosen so as to increase light transmittance and/or the conductors (transparent conductors) for the antennas 12 are arranged so as to increase light transmittance. Each antenna 12 may include a dual-frequency antenna 12a having two operating frequencies of, for example, an 800 MHz band and a 2.1 GHz band, and an antenna GND unit 12b connected to the ground (GND).

The antenna structure 1 includes two sets of antennas 12 and is compatible with a multiple-input and multiple-output (MIMO) system, which combines multiple antennas 12 to increase throughput of data transmission and reception. The feeding parts 20 are provided individually to the respective antennas 12. Accordingly, the antenna structure 1 shown in FIG. 2 includes two sets of antennas 12 and two sets of feeding parts 20.

[Flange 50]

The flange 50 is an elongated structure whose longitudinal direction coincides with the direction in which the antenna unit 10 connecting the two sets of antennas 12 extends (the X direction in the figures). The flange 50 has a divided structure in which the flange 50 is divided in the direction (the Y direction in the figures) perpendicular to the direction in which the film 11 as the base member of the antenna unit 10 extends, and has the function of positioning the film 11 from the visible side (e.g., the side below the ceiling 100) of the facility (e.g., the ceiling 100). That is, two (pair of) flanges 50 position the antenna unit 10 from the visible side of the facility such as the ceiling 100. The flange 50 is formed of a transparent resin member transmitting visible light, namely having light transmittance (visible light transmitting member). A colored visible light transmitting member may be used to match a color of the facility such as the ceiling 100, or a colored and patterned visible light transmitting member may be used to match a color and a pattern of the facility. However, the flange 50 is preferably formed of a colorless visible light transmitting member for higher compatibility with installation locations. Use of such a colorless visible light transmitting member eliminates the need for selecting members according to installation locations. This in turn eliminates the need for making various types of members and facilitates mass production. The term "flange" not only refers to an individual flange 50 but also collectively to two (pair of) flanges 50. The flange 50 may have a divided structure in which the flange 50 is divided in the direction intersecting the direction in which the film 11 as the base member of the antenna unit 10 extends.

The two (pair of) flanges 50 position the antenna unit 10 from the visible side of the facility such as the ceiling 100. In other words, the film 11 of the antenna unit 10 is sandwiched by the pair of flanges 50 (opposing surfaces 51 described later) between the two sets of antennas 12, and the posture of the film 11 between the two sets of antennas 12 is maintained by the flanges 50. In this way, the film 11 can be free from deflection by being sandwiched and fixed by the pair of flanges 50.

FIG. 5A shows the configuration of the individual flange 50. To reduce the number of parts, the pair of flanges 50 attached to the facility have the same shape.

As shown in FIG. 5A, the flange 50 includes a long part 52. Both ends of the long part 52 is formed with an assembling structure for assembling the corresponding feeding part 20 and also formed with a half lens part 31 including two half concave lenses (half concave lenses 32, 33) for constituting the lens part 30. The half concave lenses 32, 33 are connected at their individual ends. The surface of the half lens part 31 facing the assembling structure includes a surface (widened surface 32a) widened so as to surround the assembling structure. The widened surface 32a is made flush with an upper surface 52a of the long part 52. To put the above another way, the flange 50 includes multiple assembling structures and half lens parts 31 corresponding to the number of feeding parts 20 and includes the long part 52 as a connecting part to connect the multiple assembling structures and half lens parts 31.

The opposing surfaces 51 that face each other when the two flanges 50 meet have the function of sandwiching and fixing the film 11 of the antenna unit 10. Each opposing surface 51 consists of sides of the long part 52, the assembling structure and the half lens part 31, and thus the film 11 of the antenna unit 10 contacts these sides of the long part 52 and the half lens part 31. As each opposing surface 51 for sandwiching the film 11 includes the side of the half lens part 31, which extends toward the visible side (in the −Z direction), the posture of the film 11 can be kept stable. The lens part 30 is formed by mating the half lens parts 31 of the two flanges 50.

The assembling structure for the feeding part 20 at both ends of the long part 52 of the flange 50 is positioned so as to extend toward the invisible side (in the Z direction) of the ceiling 100 (facility). Each assembling structure includes a pressing surface 53 for pressing the feeding part 20, and also includes a recess 54 and a projection 55 further on the invisible side relative to the pressing surface 53. To press a feeding board (described later) by the pressing surfaces 53 using screws, one of the pressing surfaces 53 is formed with a screw tightening hole 56 at its one end (the visible side (in the −Z direction)), and the other of the pressing surfaces 53 is formed with a threaded hole 57. In the subsequent assembling, the recess 54 and the projection 55 engage with a screw part 61 of the positioning structure 60.

The half lens part 31 at both ends of the long part 52 of the flange 50 is formed so as to extend toward the visible side (in the −Z direction) of the ceiling 100 (facility), and includes the half concave lens 32 on the assembling structure side and the half concave lens 33 on the side far from the assembling structure. In other words, in the first embodiment, the lens part 30 composed of the half lens parts 31 is composed of two concave lenses (double concave lens). There is a hollow space between the half concave lens 32 and the half concave lens 33. The lens part 30 composed of the half lens parts 31 will be detailed later. Note that the term "lens part" refers not only to the lens part 30 but also to the half lens part 31.

The flange 50 may be formed by injection molding using a visible light transmitting material such as polycarbonate, acrylic, styrol, and ABS. Here, the long part 52, the assembling structures, and the half lens parts 31 of the flange 50 are integrally molded; alternatively, the assembling structures may be separate members and may be assembled with the integrally molded long part 52 and half lens parts 31.

[Positioning Structure 60]

Each positioning structure 60 includes screw parts 61 and a nut 71 as an example of a tightening part.

As shown in FIG. 3, the positioning structures 60 are respectively provided for the two sets of feeding parts 20, and each of the positioning structures 60 includes two screws parts 61 that form a cylindrical male screw structure covering a substrate (described later) extending from the feeding part 20. The cylindrical male screw structure is provided so as to rise above the ceiling, namely toward the invisible side of the facility (in the Z direction). To reduce the number of parts, the two screw parts 61 to be used in combination have the same shape, and the two screw parts 61 are fixed with four screws 69, for example. As the two opposing screw parts 61 are compatible with each other, the male screw structure can be formed by combining the two screw parts 61 in such a manner that one of the two screw parts 61 is inverted relative to the other. As the two screw parts 61 are assembled in the inverted manner, tightening directions of the left and right screws 69 (at corresponding positions in the circumferential direction) are opposite to each other. By the nature of a mold, making a cylindrical male screw structure out of a single part typically requires taking out the part from the mold while twisting it relative to the mold. In contrast, vertically dividing the cylindrical male screw structure in the direction perpendicular to the division direction of the flange 50 can reduce the work required for the molding. Note that the male screw structure may also be vertically divided in the direction intersecting the division direction of the flange 50.

Each screw part 61 of the first embodiment is formed of an opaque member opaque to visible light such as opaque resin, unlike the flange 50 formed of a visible light transmitting member. Using the opaque member allows to block light from outside and make the inside of the male screw structure formed by the two screw parts 61 hard to see.

FIG. 5B shows the configuration of the individual screw part 61. As shown in FIG. 5B, the screw part 61 includes a threaded portion 62, flat portions 63, and engaging portions 64 extending from the flat portions 63. The screw part 61 further includes threaded portions 65 for assembling and fixing the separated male screw structure, and screw holes 66. The screw part 61 further includes a cable guide groove 67 for passing and fixing the coaxial cable 40.

The threaded portion 62 has a double-threaded screw structure. The double-threaded screw includes two rows of spirals as threads thereon and makes a nut move by a distance twice the pitch per one screw revolution. If the threaded portion 62 has a single-threaded screw structure, it causes misalignment between pitches of the two divided male screw structures. This results in misalignment between crests of the threads and between roots of the threads even when the same divided parts are mated, and this make it impossible to use the same part for divided structures. Using the double-threaded screw structure, however, can make the screw parts coincide with each other. This can make one of the two threads continuous when the same screw parts 61 are mated to form the male screw structure, whereby the function as the male screw structure can take place. Further, the screw parts 61 can be manufactured using a single mold, which can reduce the costs of molds and also allow for production with high productivity.

In the first embodiment, each screw part 61 is partially formed with the flat portions 63 without the double-threaded structure on two sides of the screw part 61. Providing a flat face between the mated threaded portions 62 can simplify the mold used for forming the screw parts 61. That is, if the threaded portion 62 is formed up to a portion of the screw part 61 where the male screw structure is divided, edges of the screw at the dividing portion become steep, and forming such steep edges requires a complicated unscrewing mold. Providing the flat portions 63 can avoid such complication of the mold. Additionally, the flat portions 63 may be used as a space for attaching a product nameplate. The screw part 61 is provided with the engaging portions 64 at the positions continuous from the respective flat portions 63. The engaging portion 64 shown in FIG. 5B has a convex shape, and its counterpart engaging portion 64 has a concave shape to engage with the convex shape as shown in FIG. 3. This can eliminate displacement in the longitudinal direction during engagement, allowing for smooth tightening with the nut 71. Note that the flat portion 63 is not necessarily flat and may have a curved surface, for example.

The nut 71 of the positioning structure 60 is inserted from the invisible side and tightened to the male screw structure formed by the two screw parts 61, thereby fixing the antenna structure 1 from above the ceiling 100 (from the invisible side). As shown in FIGS. 2 and 5C, the nut 71 of the first embodiment includes: a small outer diameter portion 72 having a female thread 76 inside; a large outer diameter portion 73 having a hollow interior 77; and an annular bottom 74 at an end of the large outer diameter portion 73. Ribs 75 are provided between the small outer diameter portion 72 and the large outer diameter portion 73. The user can easily tighten the nut 71 by holding the ribs 75 with his/her fingers.

Unlike the flange 50 formed of the visible light transmitting member, the nut 71 of the first embodiment is formed of an opaque member such as opaque resin hardly transmitting visible light.

In a typical nut and screw structure, the nut can only be tightened up to a threaded portion. In contrast, the nut 71 of the first embodiment, by virtue of the interior 77 having a hollow structure, can be tightened until its bottom 74 contacts the back side of the facility such as the ceiling 100. This allows to securely fix the antenna structure 1 even to a thin ceiling board and the like. At this time, the feeding part 20 is covered with the hollow interior 77. Because of this hollow structure of the interior 77 of the nut 71 covering the feeding part 20, light from the invisible side, namely the back side of the ceiling 100, hardly leaks to the visible side of the ceiling 100.

[Feeding Part 20]

Now a description will be given of the feeding part 20 of the first embodiment. The antenna structure 1 of the first embodiment includes the multiple feeding parts 20 connected with the respective coaxial cables 40 as feeding members extended from the multiple individual antennas 12 and supplying power to the individual antennas 12.

As shown in FIG. 4, each feeding part 20 includes a feeding board 21 connected with the coaxial cable 40. A contact 13 of the antenna unit 10 is pressed by the pressing surface 53 of the flange 50 against the feeding board 21. The feeding board 21 is a board made of, for example, a glass epoxy material such as flame retardant-4 (FR-4) and composite epoxy material-3 (CEM-3) and having, for example, a copper pattern on its surface facing the contact 13 of the antenna unit 10. The feeding board 21 includes a feeding board antenna feeding portion 21a at its center, and a feeding board GND portion 21b formed around and insulated from the feeding board antenna feeding portion 21a. The feeding board antenna feeding portion 21a at the center of the feeding board 21 and a core wire 41 of the coaxial cable 40 are soldered, and the feeding board GND portion 21b on the feeding board 21 and an outer conductor 42 of the coaxial cable 40 are soldered.

In assembling the feeding part 20, the feeding board antenna feeding portion 21a and the feeding board GND portion 21b of the feeding board 21 to which the coaxial cable 40 is soldered are faced with the contact 13 of the antenna unit 10, and they are pressed against each other by the two flanges 50. A screw 58 is inserted through the screw tightening hole 56 of one of the flanges 50 and screwed into the threaded hole 57 of the other of the flanges 50, whereby the feeding board 21 and the antenna unit 10 is sandwiched between the two flanges 50. At this time, not only the contact 13 but also an upper end area 11a of the film 11 of the antenna unit 10 is sandwiched between the two flanges 50, and this can keep the film 11 as the base member of the antenna unit 10 in good posture. At one and other ends of the long parts 52 of the two mated flanges 50, the screws 58 are inserted in opposite directions.

Pressing the feeding board 21 by the two flanges 50 in this way allows to press the feeding board 21 and the contact 13 of the antenna unit 10 without the need for an additional pressing member, and ensures secure connection. The feeding part 20 is positioned on the invisible side relative to the antenna unit 10.

[Lens Part 30]

FIG. 6A shows a side of the half lens part 31 of the flange 50. Specifically, FIG. 6A shows the opposing surface 51 of the half lens part 31 at which the two (pair of) flanges 50 are mated. As shown in FIGS. 1A and 1B, when the two (pair of) flanges 50 are mated, the half lens parts 31 of these flanges 50 form a solid of revolution with the opposing surface 51 as a cross-section and constitute the lens part 30.

As described above, the half lens part 31 includes two half concave lenses (the half concave lens 32 and the half concave lens 33). There is a hollow space between the two concave lenses (the half concave lens 32 and the half concave lens 33).

The half concave lens 32 is a plano-concave lens with a flat surface on one side (Z direction) and a concave surface on the other side (−Z direction). The half concave lens 33 is a bi-concave lens with a concave surface on both sides. Specifically, the half concave lens 33 includes one side (β) having a concave surface (α) at the center and steps around the concave surface, and the other side having a concave surface (γ). As shown in the left of FIG. 6A, this stepped surface (β) is formed by dividing a flat surface (δ) indicated by the broken line by concentric cylinders spaced from each other at predetermined intervals and bringing the divided portions closer to and along the concave surface (γ) on the other side (i.e., by forming offsets). Shaping the flat surface (δ) into a stepped one (β) allows to avoid a large change in thickness (resin thickness) of the half concave lens 33 between its portions. This makes it easy to form the flange 50 by injection molding and the like. When viewed from portions of a lens where there is a large difference in thickness, images through the lens are distorted. However, such distortion of images can be reduced by avoiding a large change in thickness between portions of the lens. This also allows the images to be viewed without influence of edges of the lens when the images are viewed from a diagonal direction. Note that when corners of the stepped surface (β) are rounded, such rounded portions may function as a convex lens and thus impair the function as a concave lens. Accordingly, it is preferable that the stepped surface (β) be composed of X directional planes and Z directional planes.

In the first embodiment, the thickness of the long part 52 of the flange 50 (the width of the opposing surface 51) is about 3 mm. An excessively large thickness of the long part 52 leads to reduced transmittance, and an excessively small thickness makes it impossible to stably fix the film 11. Setting an appropriate thickness allows to both maintain transmittance and stably fix the film 11. The stepped surface (β) is provided such that the thickness of the half lens part 31 also becomes about 3 mm.

FIGS. 6B and 6C each show a through-hole 110 (left side in the figure) provided in the ceiling 100 for attaching the antenna structure 1, and the antenna structure 1 (right side in the figure) attached to the through-hole 110. As shown in FIG. 6B, looking at the ceiling 100 through the flange 50 including the lens part 30 (w 30), the through-hole 110 provided in the ceiling 100 for attaching the antenna structure 1 and the feeding part 20 disposed within the through-hole 110 look small. Without the lens part 30, in contrast, the through-hole 110 and the feeding part 20 look the size as they are, as shown in FIG. 6B. By virtue of the flange 50 having the lens part 30, the through-hole 110 in the ceiling 100 becomes hard to see from the visible side. Besides the through-hole 110, the feeding part 20 is also hard to see because the feeding part 20 is disposed within the through-hole 110.

As mentioned earlier, the nut 71 as well as the screw part 61 are formed of an opaque member to restrict (or block) light transmission from outside (e.g., from the back side of the ceiling) and prevent it from leaking to the antenna unit 10 side (e.g., the front side of the ceiling 100), whereby the structures contained within the interior 77 of the nut 71 are made hard to see. This improves visual appearance from the visible side.

Figure 7:
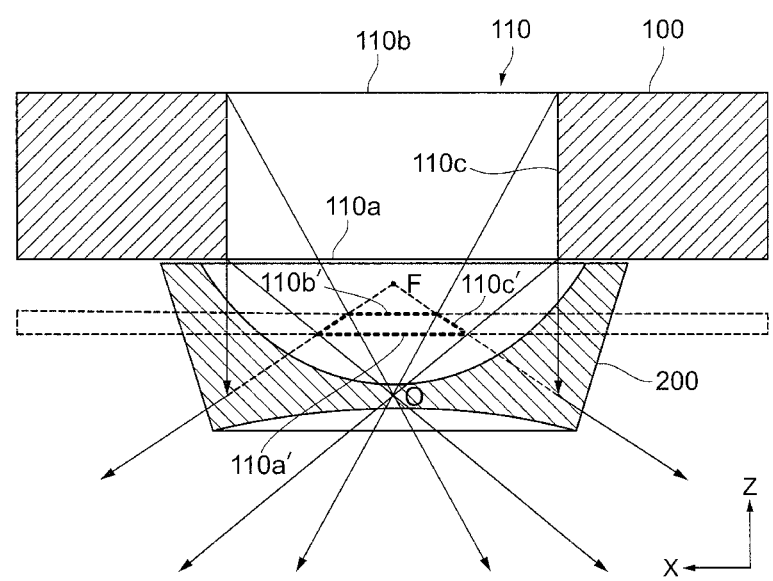
FIG. 7 explains how a through-hole in the ceiling and the feeding part look small because of the lens part.

FIG. 7 explains how the through-hole 110 in the ceiling 100 and the feeding part 20 look small because of the lens part 30.

The ceiling 100 is provided with the through-hole 110. A concave lens 200 is assumed to be positioned on the visible side (–Z direction side) relative to the ceiling 100 so as to face the through-hole 110. The concave lens 200 is a concave lens equivalently representing the lens part 30. Assume that the through-hole 110 is viewed from the visible side (–Z direction side) through the concave lens 200. The diameter of the through-hole 110 is assumed to be constant in the direction intersecting the ceiling 100 (Z direction). In other words, the diameter of the through-hole 110 is assumed to be constant from the visible side (an end 110a) to the invisible side (an end 110b). This means that a side 110c of the through-hole 110 is cylindrical.

A focal point F of the concave lens 200 is assumed to be on the visible side (–Z direction side) relative to the ceiling 100. Consequently, a virtual image 110a' of the end 110a on the visible side of the through-hole 110 is formed between the focal point F and the center O. Also, a virtual image 110b' of the end 110b on the invisible side of the through-hole 110 is formed between the virtual image 110a' and the focal point F. The virtual image 110a' is larger than the virtual image 110b'. In other words, looking at the through-hole 110 through the concave lens 200, the diameter of the invisible side (the virtual image 110b') looks smaller than the diameter of the visible side (the virtual image 110a'). This means that a virtual image 110c' of the side 110c of the through-hole 110 is visible between the virtual image 110a' and the virtual image 110b' or, put differently, the through-hole 110 looks conical.

Therefore, the positions of the concave lens 200 and its focal point F may be set such that the image of the end 110a on the visible side of the through-hole 110 becomes hard to see from the visible side. Doing so can make the color and pattern of the ceiling 100 appear spread over the through-hole 110 and the feeding part 20 disposed within the through-hole 110.

When the feeding part 20 or the like is not disposed within the through-hole 110 and the side of the through-hole 110 is allowed to be visible, then the end 110b on the invisible side of the through-hole 110 may be made hard to see.

The concave lens 200 is positioned on the visible side (–Z direction side) relative to the ceiling 100. The concave lens 200 may, however, be positioned within the through-hole 110. Such positioning may be beneficial when the side of the through-hole 110 is allowed to be visible. Note that positioning the concave lens 200 on the visible side (–Z direction side) relative to the ceiling 100 allows to gain distance between the center O of the concave lens 200 and the through-hole 110. This increases the area of the concave lens 200 functioning as a concave lens, allowing for easy design of the concave lens 200.

In the above description, the focal point F of the concave lens 200 is positioned on the visible side (–Z direction side) relative to the ceiling 100; however, the focal point F of the concave lens 200 may be positioned on the invisible side (Z direction side) relative to the ceiling 100 or positioned within a cross-section of the ceiling 100 (between the front and back sides of the ceiling 100). The concave lens 200 is an equivalent concave lens of the lens part 30. The concave lens 200 may be composed of two concave lenses each including the half concave lenses 32, 33 or may be composed of a single concave lens or three or more concave lenses.

[Assembly of the Positioning Structure 60]

After the feeding part 20 is assembled using the flanges 50 as explained above with reference to FIG. 4, the structure shown in FIG. 3 is assembled using the screw parts 61 shown in FIG. 5B. More specifically, one of the screw parts 61 is pushed in the direction (X direction) perpendicular to the direction (Y direction) in which the two flanges 50 are mated with the film 11 in between, and the other inverted one of the screw parts 61 is pushed in the –X direction. The screw part 61 is formed therein with cuts conforming to the recess 54 and the projection 55 of the flange 50. The convex-shaped engaging portions 64 of one of the screw parts 61 and the concave-shaped engaging portions 64 of the other of the screw parts 61 mate with each other, resulting in the assembly as shown in FIG. 3. The cuts inside each screw part 61 and the recess 54 and the projection 55 of each flange 50 uniquely define the positions of the flange 50 and the screw part 61 relative to each other for the assembly. At this time, the coaxial cable 40 is guided into the cable guide groove 67 shown in FIG. 5B. After that, four screws 69 are inserted and tightened in the X or –X direction per each feeding part 20, whereby the screw parts 61 of the positioning structure 60, the antenna unit 10, the feeding part 20, the coaxial cable 40 are integrated with the flanges 50, resulting in the structure as shown in FIG. 3.

[Attachment to the Ceiling 100]

By way of example, attachment of the antenna structure 1 to the ceiling 100 will be described below.

The ceiling 100 is provided with the through-hole 110 with dimensions such that the assembling structure of the flange 50 (the pressing surface 53, the recess 54, and the projection 55) and the screw part 61 of the positioning structure 60 can pass through the through-hole 110 but the widened surface 32a of the half lens part 31 of the flange 50 cannot pass through the through-hole 110.

The coaxial cable 40 and each screw part 61 of the positioning structure 60 shown in FIG. 3 are passed through the through-hole 110 from the visible side. Above the ceiling 100 (behind the ceiling 100), the nut 71 is screwed onto the screw parts 61, whereby the bottom 74 of the nut 71 (see FIG. 5C) contacts the back side of the ceiling 100 to tighten the nut 71. As a result, the upper surface 52a of the long part 52 of the flange 50 and the widened surface 32a of the lens part 30 contact the ceiling 100 from the visible side of the ceiling 100, and the bottom 74 of the nut 71 is pressed against the ceiling 100 from the invisible side. This fixes the antenna unit 10 to the ceiling 100.

As described above, only the antenna unit 10 and the flange 50 (the long part 52 and the half lens part 31 of the flange 50) constituting the antenna structure 1 appear on the visible side of the ceiling 100, and the other structures does not appear on the front of the ceiling 100. The film 11, which is the base member of the antenna unit 10, is made of a transparent material having high visible light transmittance, and the antenna 12 is formed of a transparent conductor to have high visible light transmittance; as a result, the antenna unit 10 has high light transmittance as a whole. Moreover, the flange 50, which appears on the visible side, is formed of a visible light transmitting member transmitting visible light, namely having light transmittance. As mentioned earlier, the nut 71 is an opaque member and includes the hollow interior 77. This prevents light from leaking from the invisible side of the ceiling 100 to the visible side thereof. Thus, all of the exposed structures visible to the user are made transparent while the through-hole 110 in the ceiling 100 for attaching the antenna structure 1 and the feeding part 20 are made hard to see by the lens part 30 of the flange 50. This allows the antenna structure 1 to blend in the environment.

The two (pair of) flanges 50 are used, and the half lens part 31 includes a hollow space by being composed of two half concave lenses 32, 33. Thus, only two molds (upper and lower molds) sandwiching the flange 50 are required for injection molding of the flange 50. This enables easy manufacturing of the flange 50.

[Modification]

Figure 8A:
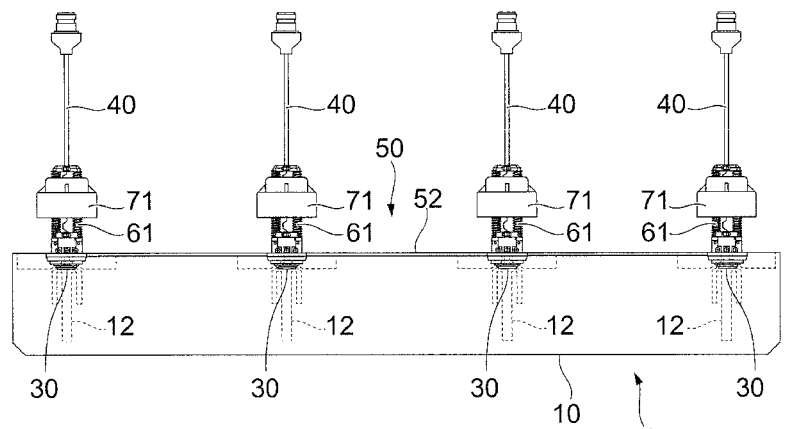
FIGS. 8A to 8C show modifications of the antenna structure.
Figure 8B:
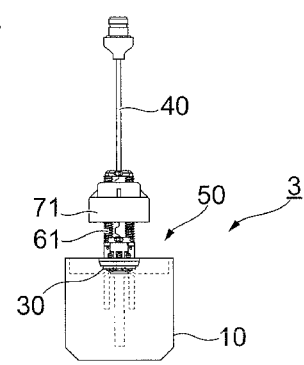
Figure 8C:
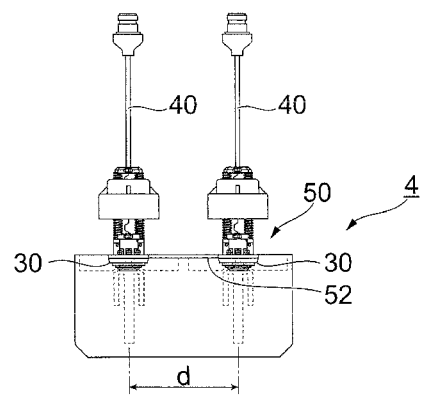

FIGS. 8A to 8C show modifications of the antenna structure 1. FIG. 8A shows a modification wherein the antenna structure includes four antenna units 10, FIG. 8B shows a modification wherein the antenna structure includes a single antenna unit 10, and FIG. 8C shows a modification wherein the antenna structure includes a differently sized antenna unit 10.

The antenna structure 2 shown in FIG. 8A includes four antennas 12 in the antenna unit 10, and accordingly includes four sets of screw parts 61 and four nuts 71 in the four positioning structures 60. The flange 50, as a modification to what is shown in FIG. 5A, includes four lens parts 30 and a long part 52 connecting them. As in this modification, the number of antennas 12 of the first embodiment is not limited to two, and multiple antennas 12 of any other number, such as four and six, may be formed in a single structure. With such a configuration too, the antenna structure 2, when attached to the ceiling 100, can blend in the environment as the flange 50 is formed of a visible light transmitting member and the structures exposed on the visible side of the ceiling 100 are made to transmit visible light. Even with an increased number of antennas 12, such as four or six antennas 12, the opposing surface 51 of each flange 50 including the side of the long part 52 can sandwich and hold the film 11 of the antenna unit 10 while keeping it stretched. Note that two flanges 50 may be used for every two antennas 12.

The antenna structure 3 shown in FIG. 8B includes a single antenna 12. As in this modification, the number of antennas 12 of the first embodiment is not limited to two or more; the single antenna 12 and the single positioning structure 60 including the two screw parts 61 and the nut 71 may be used. The flange 50 includes a single lens part 30. The flange 50 does not include the long part 52. Even with such a configuration, use of a visible light transmitting member for the flange 50 can reduce the user's discomfort that may occur during attaching the antenna structure 3 to the ceiling 100.

The flange 50 of this modification may be used for the antenna structure 1 including multiple antennas 12. In this case, the flange 50 including the lens part 30 is provided for each antenna 12. This eliminates the need for providing the flanges 50 with the long part 52 corresponding to the number of antennas 12 used.

The antenna structure 4 shown in FIG. 8C has its feature in that a distance d between two adjacent antennas 12 of multiple antennas 12 is shorter than that of the antenna structure 1 shown in FIG. 1. For example, a pitch between the centers of the two antennas 12 in the antenna structure 1 is about 200 mm while a pitch (distance d) between the centers of the two antennas 12 in the antenna structure 4 is as short as about 70 mm. In this modification too, a visible light transmitting member is used for the flange 50 to lower visibility from the visible side of the ceiling 100 and reduce conspicuousness in the environment.

Second Embodiment

In the first embodiment, the lens part 30 composed of two half concave lenses (half concave lenses 32, 33) is used. In the second embodiment, a lens part including a Fresnel lens functioning as a concave lens (a lens part 35 shown in FIGS. 9A and 9B below) is used.

Figure 9A:
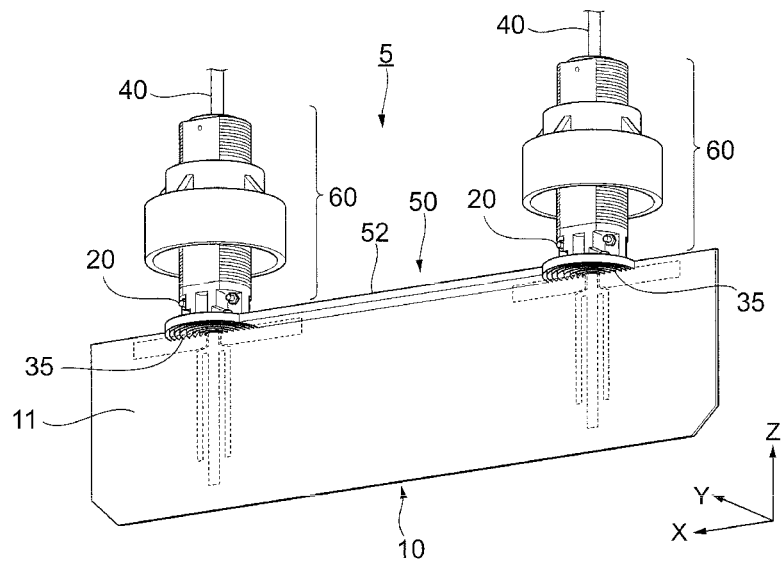
FIGS. 9A and 9B are perspective views of an antenna structure of the second embodiment.
Figure 9B:
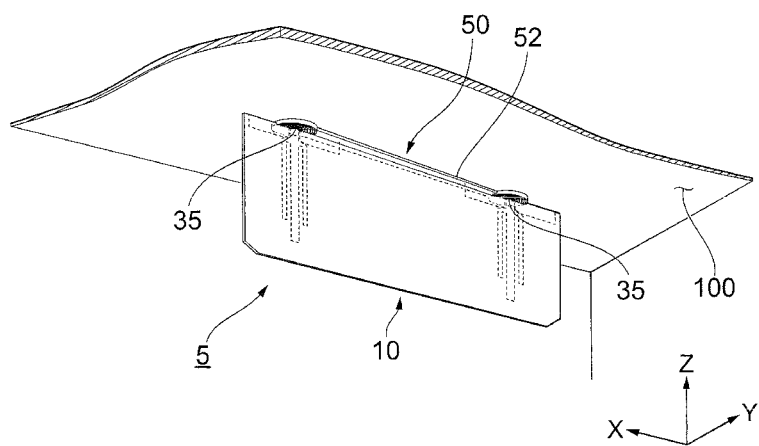

FIGS. 9A and 9B are perspective views of an antenna structure 5 of the second embodiment. FIG. 9A explains the configuration of the antenna structure 5, and FIG. 9B explains how the antenna structure 5 is attached to the ceiling 100 as an example of the facility.

As shown in FIG. 9A, similarly to the antenna structure 1 of the first embodiment, the antenna structure 5 of the second embodiment includes the antenna unit 10 formed with a high frequency circuit and the feeding parts 20 each connected with the coaxial cable 40 for supplying power to the antenna unit 10. The antenna structure 5 further includes the flange 50 and the positioning structures 60 for positioning the antenna unit 10 and the feeding parts 20 on the facility such as the ceiling 100. The flange 50 includes the lens part 35 composed of a Fresnel lens functioning as a concave lens. The flange 50 is formed of a visible light transmitting member. The antenna structure 5 is attached to the ceiling 100 via through-holes (the through-hole 110 as shown in FIGS. 10B and C) formed in the ceiling 100.

In FIG. 9A, the lens part 35 includes a structure on the back side of the antenna unit 10 that is symmetrical to the counterpart shown in FIG. 9A across the antenna unit 10 as the symmetry plane. That is, the lens part 35 is divided by the antenna unit 10. Since the antenna unit 10 is formed of a visible light transmitting member, the lens part 35 is, as a whole, a Fresnel lens functioning as a concave lens.

The antenna unit 10 and the feeding part 20 are the same as those of the first embodiment. Also, the flange 50 is the same as that of the first embodiment except for the lens part (the lens part 35 shown in FIG. 9A). Accordingly, these same components are denoted by the same reference numerals and description thereof will be omitted.

As shown in FIG. 9B, when the antenna structure 5 attached to the ceiling 100 is viewed from the visible side, which is the side below the ceiling 100 (i.e., in a living space), only the antenna unit 10 and the visible portion of the flange 50 can be seen. When viewed through the flange 50 formed of a visible light transmitting member, the through-hole 110 is hard to see because of the lens part 35 provided to the flange 50. As such, all structures exposed and visible to users are made transparent, and this allows the antenna structure 5 to blend in the environment.

Below a description will be given of the lens part 35 of the flange 50, which is a difference of the antenna structure 5 from the antenna structure 5 of the first embodiment.

As shown in FIG. 9A, two lens parts 35 are provided on respective ends of the flange 50 that is an elongated structure whose longitudinal direction coincides with the direction in which the antenna unit 10 connecting the two sets of antennas 12 extends (the X direction in the figure). Each lens part 35 includes, on the visible side, grooves functioning as a Fresnel lens. A surface on the visible side of the lens part 35 (surface connecting tops of the grooves of the Fresnel lens) lies flush with the upper surface 52a of the long part 52 of the flange 50.

[Lens Part 35]

Figure 10A:
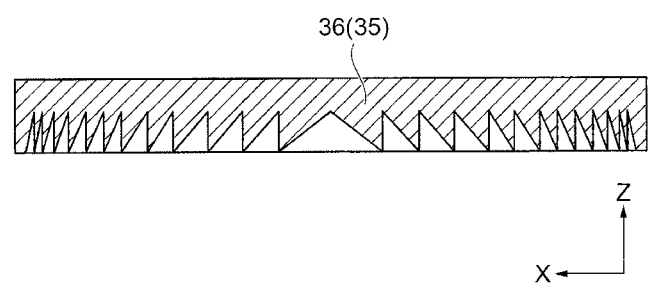
FIGS. 10A to 10C explain a configuration of the lens part of the flange and functions of the lens part.
Figure 10B:
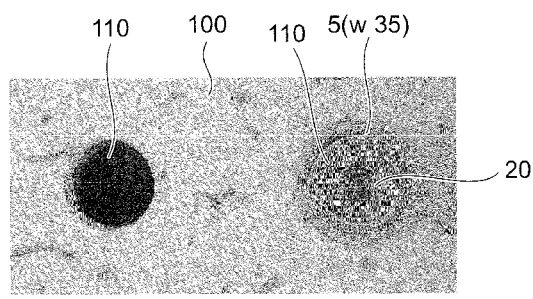
Figure 10C:
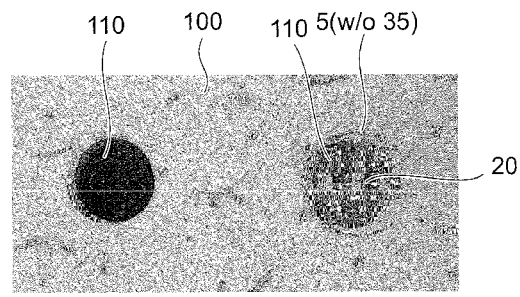

FIGS. 10A to 10C explain a configuration of the lens part 35 of the flange 50 and functions of the lens part 35. FIG. 10A explains the configuration of the lens part 35, FIG. 10B explains the case where the lens part 35 is provided (w 35), and FIG. 10C explains the case where the lens part 35 is not provided (w/o 35). FIG. 10C is the same as FIG. 6C.

FIG. 10A shows a side of a half lens part 36 of the flange 50. That is, similarly to the first embodiment, the antenna structure 5 includes two (pair of) flanges 50, and each flange 50 includes the half lens part 36. The half lens parts 36 are mated to constitute the lens part 35. In other words, FIG. 10A shows an opposing surface 51 of each half lens part 36 at which the two (pair of) flanges 50 are mated. The lens part 35 is configured to become a solid of revolution with the opposing surface 51 as a cross-section when the two (pair of) flanges 50 are mated.

The lens part 35 includes, on the visible side (−Z direction side), the grooves functioning as a Fresnel lens. The grooves are formed by cutting a concave lens with a flat surface on one side and a concave surface on the other side at equally spaced cutting planes in the thickness direction to thereby shift the concave surface to a predetermined thickness. The concave lens may be set to any shape according to a focal length and other factors. The grooves for functioning as a Fresnel lens may also be formed by cutting the above concave lens with equally spaced concentric cylinders as cutting planes to thereby shift the concave surface to a predetermined thickness. Any other method may be used to form the grooves. Making the grooves as a Fresnel lens too fine to be visually recognizable allows the antenna structure 5 to blend in the environment.

FIGS. 10B and 10C each show a through-hole 110 (left side in the figure) provided in the ceiling 100 for attaching the antenna structure 5, and the flange 50 (right side in the figure) mounted in the through-hole 110. As shown in FIG. 10B, looking at the ceiling 100 through the lens part 35, the through-hole 110 provided in the ceiling 100 for attaching the antenna structure 5 and the feeding part 20 disposed within the through-hole 110 look small. Without the lens part 35, in contrast, the through-hole 110 looks the size as it is, as shown in FIG. 10C. By virtue of the flange 50 having the lens part 35, the through-hole 110 in the ceiling 100 becomes hard to see from the visible side. Besides the through-hole 110, the feeding part 20 is also hard to see because the feeding part 20 is disposed within the through-hole 110.

The modifications of the first embodiment shown in FIGS. 8A to 8C may be applied to the second embodiment.

As the lens part 35 is composed of a Fresnel lens, a mold for forming grooves functioning as a Fresnel lens is required for injection molding of the flange 50, in addition to the two molds sandwiching the flange 50. However, use of a Fresnel lens for the lens part 35 can reduce the portion protruding to the visible side (make the lens part 35 thin), as compared to the lens part 30 of the first embodiment.

The long part 52, the assembling structure, and the lens part 35 of the flange 50 are integrally formed; alternatively, the assembling structure may be a separate member and assembled with the integrally formed long part 52 and the lens part 35. The lens part 35 may include the Fresnel lens on both of the visible and invisible sides, or may include the Fresnel lens not on the visible side but on the invisible side.

Third Embodiment

In the first and the second embodiments, the antenna structure has been described as an example of the structure including a transparent conductor.

In the third embodiment, the structure including a transparent conductor is a radio wave shielding structure.

Figure 11A:
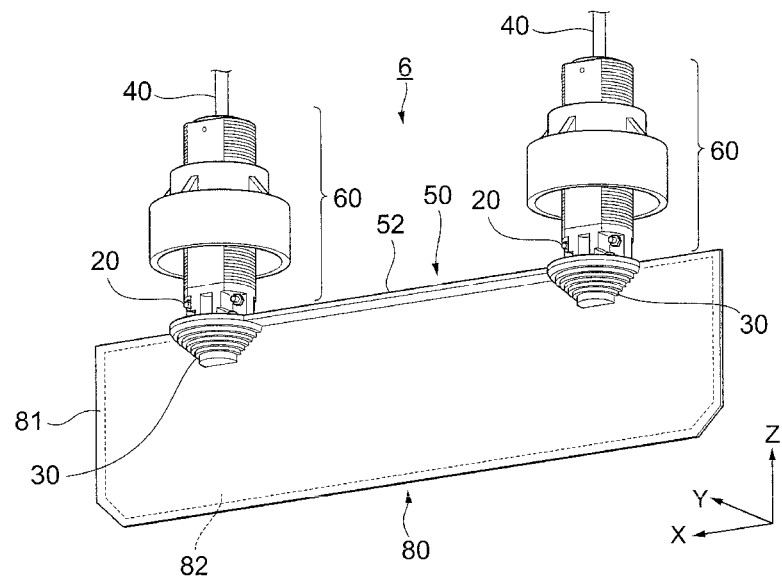
FIGS. 11A and 11B are perspective views of a radio wave shielding structure of the third embodiment.
Figure 11B:
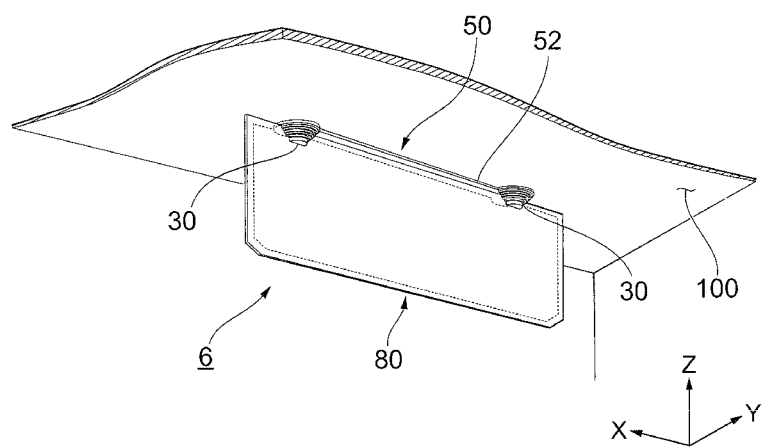

FIGS. 11A and 11B are perspective views of a radio wave shielding structure 6 of the third embodiment. FIG. 11A explains the configuration of the radio wave shielding structure 6, and FIG. 11B explains how the radio wave shielding structure 6 is attached to the ceiling 100 as an example of the facility. As shown in FIG. 11A, the antenna unit 10 of the antenna structure 1 of the first embodiment is replaced with a radio wave shielding unit 80.

As shown in FIG. 11A, similarly to the antenna unit 10 of the antenna structure 1 of the first embodiment, the radio wave shielding structure 6 of the third embodiment includes: the radio wave shielding unit 80, which is for example a flexible printed circuit board, and the feeding parts 20 each connected with the coaxial cable 40 as a feeding member for supplying power to the radio wave shielding unit 80. The radio wave shielding structure 6 further includes the flange 50 and the positioning structures 60 for positioning the radio wave shielding unit 80 and the feeding parts 20 on the facility such as the ceiling 100. The flange 50 is formed of a transparent member. The radio wave shielding structure 6 is attached to the ceiling 100 via through-holes in the ceiling 100 (see FIGS. 6B and 6C).

The feeding part 20 and the flange 50 are the same as those of the first embodiment, and accordingly they are denoted by the same reference numerals and description thereof will be omitted.

As shown in FIG. 11B, when the radio wave shielding structure 6 attached to the ceiling 100 is viewed from the visible side, which is the side below the ceiling 100 (i.e., in a living space), only the radio wave shielding unit 80 and the visible portion of the flange 50 can be seen. When viewed through the flange 50 formed of a transparent member, the through-hole 110 is hard to see because of a lens part (lens part 30 described later) provided to the flange 50. As such, all structures exposed and visible to users are made transparent, and this allows the radio wave shielding structure 6 to blend in the environment.

Below a description will be given of the radio wave shielding unit 80, which is a difference of the radio wave shielding structure 6 from the antenna structure 1 of the first embodiment.

[Radio Wave Shielding Unit 80]

The radio wave shielding unit 80 includes, as its base member, a film 81 made of a transparent resin material that can be formed into a film and has high visible light transmittance, such as PET resin. The film 81 is formed with a radio wave shielding membrane 82 whose material is chosen so as to increase light transmittance. By being set to the ground (GND) via the feeding part 20, the radio wave shielding membrane 82 reflects radio waves. This allows the radio wave shielding membrane 82 to function as a shield and block ratio waves from traveling through the radio wave shielding membrane 82.

As the radio wave shielding membrane 82 may be set to GND, the feeding part 20 does not require separated feeding board antenna feeding portion 21a and feeding board GND portion 21b. Instead of the coaxial cable 40, a cable without the outer conductor 42 may be used. The radio wave shielding membrane 82 is not necessarily set to GND as long as radio waves can be blocked in other ways.

The radio wave shielding structure 6 is required to give the radio wave shielding membrane 82 an area necessary for radio wave shielding; as long as this condition is met, the radio wave shielding structure 6 may be laterally elongated and fixed to the ceiling 100 by multiple positioning structures 60, like the antenna structure 2 shown in FIG. 8A. Alternatively, the radio wave shielding structure 6 may be configured like the antenna structures 3 and 4 shown in FIGS. 8B and 8C.

The lens part 30 of the flange 50 may be replaced with the lens part 35 composed of a Fresnel lens as described in the second embodiment.

The lens parts 30 and 35 in the first to the third embodiments are a concave lens; alternatively, they may be a convex lens. When the lens part 30 and 35 are configured as a convex lens, distance to the ceiling 100 and a focal length may be adjusted so as to make the through-hole 110 look blurry, whereby the through-hole 110 and the feeding part 20 may be made hard to see.

The antenna structures 1 to 5 and the radio wave shielding structure 6 have been described above as an example of the structure including a transparent conductor. The structure including a transparent conductor may, however, be any other structure.

In the first to the third embodiments, the antenna structures 1 to 5 and the radio wave shielding structure 6 are attached to the ceiling as an example of the facility; however, they may be attached to any other facility such as a vertical wall. In this case, the side to which the antenna 12 or the radio wave shielding membrane 82 faces is defined as the visible side, and the side opposite to the visible side is defined as the invisible side.

Besides the first to the third embodiments described above, various modifications may be made while keeping with the essential teaching of the present invention.

The invention claimed is:

1. A structure including a transparent conductor, the structure comprising:
   a base member including the transparent conductor and transmitting visible light;
   a positioning structure configured to position the base member from an invisible side of a facility; and
   a flange configured to position the base member from a visible side of the facility, the flange including a lens part at a position facing the positioning structure, the flange transmitting visible light.

2. The structure according to claim 1, wherein the lens part of the flange comprises a concave lens.

3. The structure according to claim 2, wherein the concave lens of the lens part comprises a concave surface on the invisible side and a stepped surface along the concave surface on the visible side.

4. The structure according to claim 2, wherein the concave lens of the lens part comprises a Fresnel lens.

5. The structure according to claim 1, wherein the flange has a divided structure in which the flange is divided in a direction intersecting a direction in which the base member extends.

6. The structure according to claim 5, wherein
   the lens part is divided by the divided structure of the flange, and
   the divided lens part sandwiches and fixes the base member.

7. The structure according to claim 5, wherein the positioning structure includes a screw part and a tightening part, the screw part being divided in a direction intersecting the direction in which the flange is divided, the tightening part being screwed into the screw part to tighten the flange to the facility.

8. The structure according to claim 1, wherein
   the flange comprises a plurality of the lens parts corresponding to the number of a plurality of the positioning structures, and
   the flange comprises a connecting part connecting the plurality of the lens parts.

9. The structure according to claim 1, further comprising a feeding part connected with a feeding member for supplying power to the transparent conductor, wherein
   when the base member is attached to the facility, the feeding part is positioned to face the invisible side of the facility relative to the base member.

10. The structure according to claim 9, wherein the feeding part is integrally formed with the flange and positioned on a side of the flange that is opposite to another side of the flange on which the base member is attached.

* * * * *